(12) United States Patent
Wang et al.

(10) Patent No.: US 9,500,955 B2
(45) Date of Patent: Nov. 22, 2016

(54) EXPOSURE APPARATUS AND EXPOSURE METHOD

(71) Applicant: BOE TECHNOLOGY GROUP CO., LTD., Beijing (CN)

(72) Inventors: Can Wang, Beijing (CN); Jianwei Yu, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 195 days.

(21) Appl. No.: 14/351,083

(22) PCT Filed: Nov. 12, 2013

(86) PCT No.: PCT/CN2013/086978
§ 371 (c)(1),
(2) Date: Apr. 10, 2014

(87) PCT Pub. No.: WO2014/190676
PCT Pub. Date: Dec. 4, 2014

(65) Prior Publication Data
US 2015/0293455 A1    Oct. 15, 2015

(30) Foreign Application Priority Data
May 30, 2013  (CN) .......................... 2013 1 0210193

(51) Int. Cl.
G03F 7/20    (2006.01)
(52) U.S. Cl.
CPC ........... G03F 7/7015 (2013.01); G03F 7/2008 (2013.01); G03F 7/7035 (2013.01); G03F 7/70075 (2013.01)
(58) Field of Classification Search
CPC ........................... G03F 7/2008; G03F 7/7015
USPC .......................................................... 355/67
See application file for complete search history.

(56) References Cited

U.S. PATENT DOCUMENTS 4,936,666 A * 6/1990 Futhey ................. G02B 5/1876
                                                    359/566
5,005,959 A * 4/1991 Nagata .................... G03F 7/702
                                                    359/726

(Continued)

FOREIGN PATENT DOCUMENTS

CN     1479172 A      3/2004
CN     1866055 A     11/2006

(Continued)

OTHER PUBLICATIONS

English Translation of the International Search Report of PCT/CN2013/086978 published in English on Dec. 4, 2014.

(Continued)

Primary Examiner — Steven H Whitesell Gordon
(74) Attorney, Agent, or Firm — Collard & Roe, P.C.

(57) ABSTRACT

An exposure apparatus comprises a light source (1) and a diffusing sheet (2) provided below the light source (1), a side of the diffusing sheet (2) adjacent to the light source (1) is an incident face (21) and the other side opposite to the incident face (21) is an emitting face (22); the light emitted from the light source (1) enters the diffusing sheet (2) through the incident face (21), is refracted within the diffusing sheet (2), and after being diffused, emits out evenly throughout the emitting face (22). The exposure apparatus enables an evenly exposure of the photoresist on the substrate. An exposure method using such an exposure apparatus is also disclosed.

5 Claims, 4 Drawing Sheets

(56) References Cited

U.S. PATENT DOCUMENTS

| | | | |
|---|---|---|---|
| 6,163,405 | A | 12/2000 | Chang et al. |
| 7,364,839 | B2 | 4/2008 | Hayasaki et al. |
| 7,515,229 | B2 | 4/2009 | Chang |
| 7,645,058 | B2 | 1/2010 | Kurokawa et al. |
| 7,740,992 | B2 | 6/2010 | Inao et al. |
| 2002/0008911 | A1* | 1/2002 | Sekine .............. G02B 27/0043 359/566 |
| 2005/0024746 | A1* | 2/2005 | Shimura ................ F21V 5/045 359/742 |
| 2005/0078294 | A1* | 4/2005 | Nellissen ............. G03F 7/2002 355/77 |
| 2006/0262410 | A1 | 11/2006 | Toyoda |
| 2009/0092934 | A1 | 4/2009 | Christophersen et al. |
| 2010/0309411 | A1 | 12/2010 | Shibata et al. |
| 2012/0212717 | A1 | 8/2012 | Hatanaka |
| 2015/0293455 | A1 | 10/2015 | Wang et al. |

FOREIGN PATENT DOCUMENTS

| | | | |
|---|---|---|---|
| CN | 1908754 | A | 2/2007 |
| CN | 1942788 | A | 4/2007 |
| CN | 1977360 | A | 6/2007 |
| CN | 101021579 | A | 8/2007 |
| CN | 101042488 | A | 9/2007 |
| CN | 101907734 | A | 12/2010 |
| CN | 101976019 | A | 2/2011 |
| CN | 102520591 | A | 6/2012 |
| CN | 102597880 | A | 7/2012 |
| CN | 103048894 | A | 6/2013 |
| CN | 103309172 | A | 9/2013 |
| JP | H0843960 | A | 2/1996 |
| JP | 2916010 | B2 | 7/1999 |
| JP | 2010062309 | A | 3/2010 |
| WO | 2009/048896 | A1 | 4/2009 |

OTHER PUBLICATIONS

Third Chinese Office Action of Chinese Application No. 201310210193.9, mailed Jun. 3, 2015 with English translation.
Fourth Chinese Office Action of Chinese Application No. 201310210193.9, mailed Sep. 14, 2015 with English translation.
English translation of the Written Opinion of the International Searching Authority of PCT/CN2013/086978, mailed Mar. 13, 2014.
Second Chinese Office Action of Chinese Application No. 201310210193.9, mailed Feb. 5, 2015 with English translation.
Chinese Office Action of Chinese Application No. 201310210193.9 with English translation, mailed Aug. 1, 2014.
International Search Report, International Preliminary Report on Patentability and Written Opinion of the International Searching Authority of PCT/CN2013/086978 in Chinese, mailed Mar. 13, 2014.

* cited by examiner

EXPOSURE APPARATUS AND EXPOSURE METHOD

CROSS REFERENCE TO RELATED APPLICATIONS

This application is the National Stage of PCT/CN2013/086978 filed on Nov. 12, 2013, which claims priority under 35 U.S.C. §119 of Chinese Application No. 201310210193.9 filed on May 30, 2013, the disclosure of which is incorporated by reference. The international application under PCT article 21(2) was not published in English.

TECHNICAL FIELD

The embodiments of the present invention relates to an exposure apparatus and an exposure method.

BACKGROUND

Thin film transistor liquid crystal displays (TFT-LCDs) have obtained a predominant position in current panel display market due to characteristics such as compactness, lower power consumption, no radiation, and so on.

A method for forming the metal conductive layer in the gate line or the data line in a TFT array substrate comprises: first forming a metal layer on the substrate, then coating photoresist on the metal layer, then exposing the photoresist layer with a mask plate, and finally processing the metal layer in an etching process.

An existing process for exposing the photoresist using an exposure apparatus is conducted as follows. The substrate is first brought into an expose procedure, the substrate is loaded onto a substrate carrier and is preliminarily aligned, then the substrate is adsorbed onto the substrate carrier by vacuum adsorption units, and then the gap between the substrate and the mask plate is regulated so as to achieve the precise position between the substrate and the mask plate, and after the position, the photoresist on the substrate is exposed with UV-light, then the vacuum absorption between the substrate and the substrate carrier is released to unload the substrate from the substrate carrier.

SUMMARY

Embodiments of the present invention provide an exposure apparatus and an exposure method which can achieve uniform exposure of the photoresist on a substrate.

One aspect of the present invention provides an exposure apparatus comprising a light source and a diffusing sheet provided below the light source, a side of the diffusing sheet adjacent to the light source is an incident face and the other side opposite to the incident face is an emitting face; light emitted from the light source enters the diffusing sheet through the incident face, is refracted within the diffusing sheet, and after being diffused, emits out evenly throughout the emitting face.

In the diffusing sheet, for example, one of the incident face and the emitting face is a flat face, and the other is a spherical convex face.

In the diffusing sheet, for example, one of the incident face and the emitting face is a flat face, and the other comprises a central spherical face and several concentric annular cambered face.

In the concentric annular cambered faces of the diffusing sheet, for example, the closer the concentric annular cambered faces are adjacent to the central spherical face, the more densely the concentric annular cambered faces are arranged; while the farther the concentric annular cambered faces are away from the central spherical face, the more sparsely the concentric annular cambered faces are arranged.

For example, the light source may be a point source which is located at the focal point of the diffusing sheet.

For example, the diffusing sheet may have a dimension greater than or equal to that of the substrate to be exposed.

For example, the exposure apparatus may further comprise a mask plate carrier for bearing a mask plate, and the diffusing sheet is located between the light source and the mask plate carrier.

For example, the material for the diffusing sheet is glass, quartz crystal or transparent plastic.

A second aspect of the present invention provides an exposure method by using the above exposure apparatus, comprising: placing the mask plate on the mask plate carrier, and placing the substrate to be exposed on the substrate carrier; arranging the diffusing sheet between the light source and the mask plate carrier, the diffusing sheet being configured for refracting the light from the light source such that the light emits out evenly from the diffusing sheet; exposing the substrate to be exposed.

BRIEF DESCRIPTION OF THE DRAWINGS

In the following, a brief introduction of the drawings of the embodiment of the present invention will be given so as to describe the technical solutions of the embodiments more clearly, and its obvious that the drawings described hereinafter just concern some embodiments of the present invention, rather than limitation to the present invention.

REFERENCE NUMERALS

| | | |
|---|---|---|
| 1-light source; | 2-diffusing sheet; | 21-incident face; |
| 22-emitting face. | | |

DETAILED DESCRIPTION

To make clearer the aim, technical solutions and advantages of the embodiments of the present invention, a clear and complete description about the technical solution of the embodiment of the present invention will be made with reference to the accompanying drawings of the embodiments of the present invention. Apparently, the described embodiments are only part of the embodiments of the present invention, rather than all of the embodiments. Based on the described embodiments of the present invention, all of the other embodiments obtained by the skilled in this art, without any creative works, fall into the protective scope of the present invention.

As for conventional exposure methods, during research process the inventors have noted that, when the photoresist on a substrate is subjected to an expose process, the expose extent by which the photoresist at the edge of the substrate is exposed is different from the expose extent by which the photoresist at the centre of the substrate, under the influence of harmful factors, such as light diffraction, non-uniform illumination and the like, which affects the quality of the array substrate and further affects the display quality of the finally resultant TFT-LCD.

Figure 1:
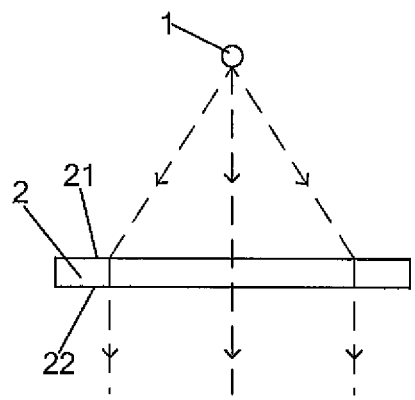
FIG. 1 is the first schematic view of the exposure apparatus of the embodiment of the present invention.

As illustrated in FIG. 1, the embodiment of the present invention provides an exposure apparatus comprising a light source 1 and a diffusing sheet 2 located below the light source 1, the side of the diffusing sheet 2 adjacent to the light source 1 is the incident face 21, and the other side opposite to (away from) the incident face 21 is an emitting face 22.

Light emitted from the light source 1 enters the diffusing sheet 2 through the incident face 21, is refracted within the diffusing sheet 2, and after being diffused, emits evenly throughout the emitting face 22.

This embodiment provides an exposure apparatus comprising a light source and a diffusing sheet located below the light source, the relatively concentric light emitted from the light source can be scattered evenly by the diffusing sheet, thereby improving the quality for exposing the photoresist on the substrate and thus the quality of the resulted array substrate, and improving the display effect of the fabricated liquid crystal display, and finally, its possible to better the service experience for the user.

Figure 2A:
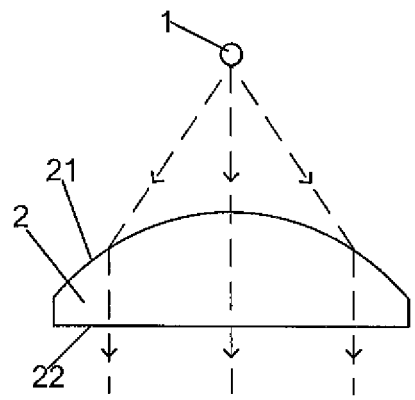
FIG. 2a is the second schematic view of the exposure apparatus of the embodiment of the present invention.

The diffusing sheet 2 may have various specific configurations, all of which are available for the embodiment of the present invention, as long as they can act to refract and diffuse the concentric light. For example, one of the incident face 21 and the emitting face 22 of the diffusing sheet 2 is a flat face, and the other is a spherical convex face, as illustrated in FIG. 2a; the incident face 21 of the diffusing sheet 2 is a spherical convex face, the emitting face 22 is a flat face, the light is deflected when being in or upon entering into the diffusing sheet 2, such that relatively concentric light is diffused and evenly emitted throughout the whole emitting face 22, and the light rays are substantially parallel to each other. Such a diffusing sheet 2 can effectively diffuse the relatively concentric light emitted from the light source, thus improving the evenness (uniformity) of the light received by the photoresist on the substrate to be exposed.

Figure 2B:
FIG. 2b is a variant for the diffusing sheet of the exposure apparatus.

Similarly, the diffusing sheet 2 may have a configuration in which the two faces are both spherical convex faces. For example, the spherical convex faces on the two faces may be different. In another illustration, the diffusing sheet 2 may comprise a micro-lens array 2a formed on the incident face, as illustrated in FIG. 2b.

Due to the fact that the diffusing sheet 2 as illustrated in FIG. 2a has a greater thickness, where it's impossible for the exposure apparatus to contain a diffusing sheet 2 having such a great thickness, the diffusing sheet 2 as illustrated in FIG. 2a may be modified in its configuration.

Figure 3A:
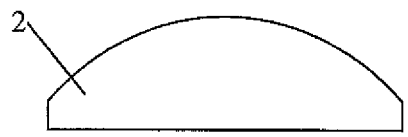
FIGS. 3a-3d are schematic views illustrating the processes of making the diffusing sheet of the embodiment of the present invention.
Figure 3B:
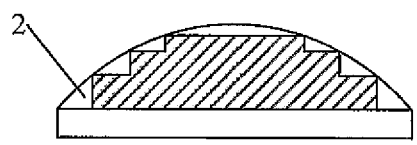
Figure 3C:
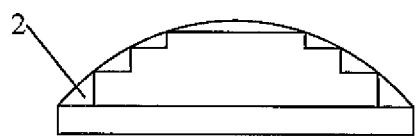

One example for such a modification may be as follows. Firstly, design is made about the radius and the focal length of the diffusing sheet 2 as illustrated in FIG. 3a, and the simulation software, for example, CAD, is used to produce the profile of the diffusing sheet; afterwards, as illustrated in FIG. 3b, it's needed to find out the portions of the diffusing sheet 2 as illustrated in FIG. 3a not affecting the light path (the shaded portions in the Figure), in fact, these portions are composed of several flat cylindrical shapes having concurrent central axis; as illustrated in FIG. 3c, the above portions not affecting the light path are removed, and the remained portions are translated to the bottom part of the diffusing sheet 2 as illustrated in FIG. 3a, and finally, a diffusing sheet 2 is formed as illustrated in FIG. 3d, the diffusing sheet as illustrated in FIG. 3d comprises several protrusions, the edge of the section of the protrusion located at the centre is in an arc, and the other protrusions have a right triangle-like or circle sector shape in their section and are symmetrically arranged at the both sides of the central protrusion in an order from the smaller to the larger (i.e., the section area or arc length of the protrusions).

Herein, the term "right triangle-like" means a figure composed of two right-angle sides orthogonal to each other and a curve having a certain curvature; the two right-angle sides orthogonal to each other may be equal or not.

For example, the central angle of the circle sector is preferably 90°.

Figure 3D:
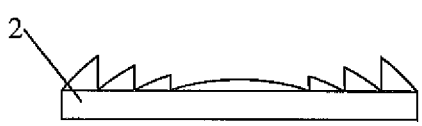
Figure 4:
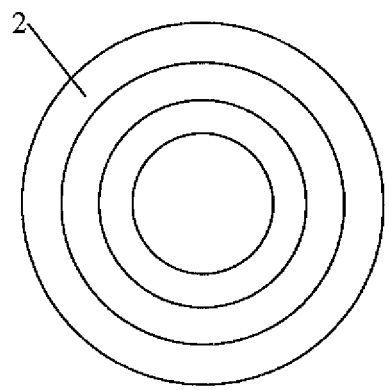
FIG. 4 is the first top view of the diffusing sheet of the embodiment of the present invention.

For example, the diffusing sheet 2 illustrated in FIG. 3d may have a top view as illustrated in FIG. 4.

Hence, the configuration of the diffusing sheet 2 may also be that the one of the incident face 21 and the emitting face 22 is a flat face while the other comprises a central spherical face and several concentric annular cambered faces, i.e., as illustrated in FIG. 4, which also has effect identical to that of the diffusing sheet 2 as illustrated in FIG. 2a, and the required material is less and the manufacture cost is lower.

Figure 5:
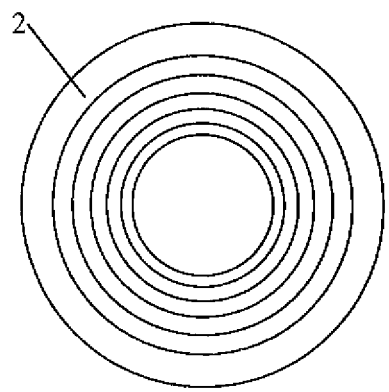
FIG. 5 is the second top view of the diffusing sheet of the embodiment of the present invention.

The dimensions of the central spherical face of the diffusing sheet 2 in FIG. 4 may be regulated as required; and regarding the numbers of the several concentric annular cambered faces around the central spherical face, and the dimension of any one thereof may be provided according to practical situation. For example, the configuration for the diffusing sheet 2 of FIG. 4 may be set as follows: the closer the concentric annular cambered face is adjacent to the central spherical face, the more densely the concentric annular cambered face is arranged, but the farther the concentric annular cambered face is away from the central spherical face, the more sparsely the concentric annular cambered face is arranged, the resultant effect is as illustrated in FIG. 5. With such a design, the concentric annular cambered faces of the diffusing sheet 2 is arranged more densely where the light intensity is stronger, so that the diffusing sheet has a more significant diffusion effect, which further improves the distribution of intensity and density of the light from the light source 1 so as to achieve the uniformization effect of light. Generally, light from the central region of the light source 1 has a light intensity greater than the light from the regions far away from the central region.

Generally, the diffusing sheet 2 may be made from transparent materials, such as glass, quartz crystal, transparent plastic or the like. Where the material for the diffusing sheet 2 is plastics, the diffusing sheet 2 may be made through an injection molding process.

Figure 6:
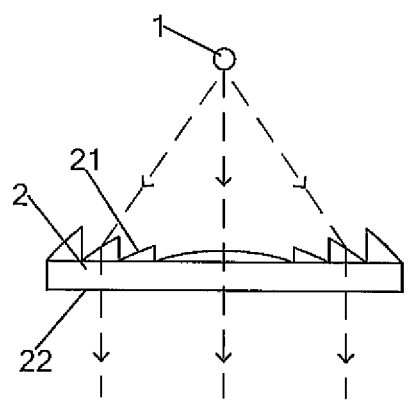
FIG. 6 is the third schematic view of the exposure apparatus of the embodiment of the present invention.

For example, the light source 1 is a point source, and where the diffusing sheet 2 has a configuration as illustrated in FIG. 2a or FIG. 6, for the purpose of improving the diffusion effect of the diffusing sheet 2 upon the relatively concentric light from the light source 1, the light source 1 may be located at the focal point of the diffusing sheet 2.

Figure 7:
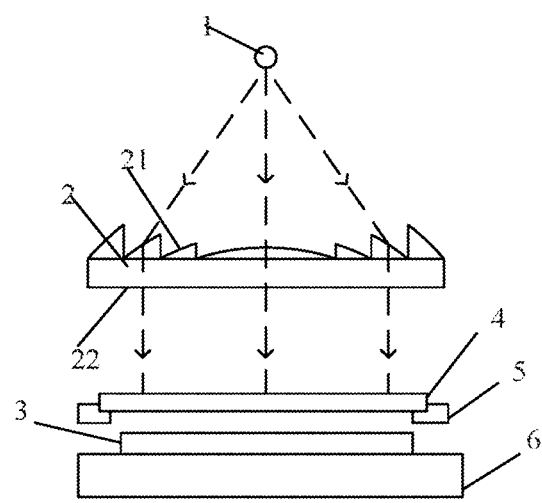
FIG. 7 is the fourth schematic view of the exposure apparatus of the embodiment of the present invention.

Furthermore, as shown in FIG. 7, in order to ensure that all the parts of the photoresist on the substrate 3 to be exposed can receive light of almost the same light intensity during the expose process, the dimensions of diffusing sheet 2 should be greater than or equal to the dimensions of the substrate 3 to be exposed. Further, the shape of the diffusing sheet 2 may also be set according to the shape of the substrate.

Because the exposure apparatus commonly further comprises a mask plate carrier 5 for bearing the mask plate 4, the diffusing sheet 2 may be located between the light source 1 and the mask plate carrier 5, and such an exposure apparatus here is a proximity exposure apparatus.

Where the exposure apparatus is a contact exposure apparatus, the diffusing sheet 2 may be arranged between the light source 1 and the substrate carrier 6, and the position for arranging the mask plate 4 is obtained by regulating the distance between the diffusing sheet 2 and the substrate carrier 6.

An embodiment of the present invention also provides an exposure method using the above-mentioned exposure apparatus, and the exposure method may comprise:

Step S101, placing the mask plate on the mask plate carrier, and placing the substrate to be exposed on the substrate carrier;

Step S102, arranging the diffusing sheet between the light source and the mask plate carrier, the diffusing sheet being configured for refracting the light emitted from the light source such that the light emits out evenly from the diffusing sheet; and Step S103, exposing the substrate to be exposed.

With the method of the present embodiment, it's possible to evenly emit out the relatively concentric light from the light source, thereby improving the evenness of the light received by the photoresist on the substrate to be exposed so as to improve the expose quality of the photoresist on the substrate, and thus improving the quality of the fabricated array substrate.

The above embodiments are only exemplary embodiments of the present invention, rather than limiting the protective scope of the present invention, the protective scope of the present invention is defined by the accompanying claims.

The invention claimed is:

1. An exposure apparatus comprising a light source and a diffusing sheet provided below the light source,
   wherein a side of the diffusing sheet adjacent to the light source is an incident side and the other side opposite to the incident side is an emitting side; light emitted from the light source enters the diffusing sheet through the incident side, is refracted within the diffusing sheet, and after being diffused, emits out evenly throughout the emitting side, one of the incident side and the emitting side is a flat surface, and the other comprises a central spherical surface and a plurality of concentric annular cambered surfaces and a distance between each concentric annular cambered surfaces and an immediately inner concentric annular cambered surface becomes larger from a center thereof;
   a mask plate carrier for bearing a mask plate,
   wherein the diffusing sheet is located between the light source and the mask plate carrier.

2. The exposure apparatus according to claim 1, wherein the light source is a point source which is located at the focal point of the diffusing sheet.

3. The exposure apparatus according to claim 1, wherein the diffusing sheet has a dimension greater than or equal to that of a substrate to be exposed.

4. The exposure apparatus according to claim 1, wherein the material for the diffusing sheet is glass, quartz crystal or transparent plastic.

5. An exposure method by using the exposure apparatus according to claim 1, comprising:
   placing a mask plate on a mask plate carrier, and placing a substrate to be exposed on the substrate carrier;
   arranging a diffusing sheet between the light source and the mask plate carrier, the diffusing sheet being configured for refracting light from the light source such that the light emits out evenly from the diffusing sheet; and
   exposing a substrate to be exposed.

* * * * *